(12) United States Patent
Bynum et al.

(10) Patent No.: US 7,592,959 B1
(45) Date of Patent: Sep. 22, 2009

(54) RADIO FREQUENCY INTERFERENCE SUPPRESSION ENCLOSURE

(75) Inventors: John C. Bynum, Olathe, KS (US);
William A. Ogier, Shawnee, KS (US);
Ross Pierson, Lincoln, NE (US); Jerrod L. Basgall, Weatherby Lake, MO (US)

(73) Assignee: Sprint Communciations Company L.P., Overland Park, KS (US)

( * ) Notice: Subject to any disclaimer, the term of this patent is extended or adjusted under 35 U.S.C. 154(b) by 169 days.

(21) Appl. No.: 11/755,242

(22) Filed: May 30, 2007

(51) Int. Cl.
*G01R 29/10* (2006.01)
*H01Q 1/52* (2006.01)

(52) U.S. Cl. .................................. 343/703; 343/841
(58) Field of Classification Search ............... 343/703, 343/841; 324/627, 628; 702/182; 342/1, 342/4, 165; 181/290; 455/67.1, 67.4
See application file for complete search history.

(56) References Cited

U.S. PATENT DOCUMENTS

| | | | |
|---|---|---|---|
| 5,507,012 A | 4/1996 | Luxon et al. | |
| 6,626,264 B1* | 9/2003 | Christen | 181/290 |
| 6,657,214 B1* | 12/2003 | Foegelle et al. | 250/506.1 |
| 7,190,301 B2* | 3/2007 | Krenz et al. | 342/1 |
| 7,286,961 B2* | 10/2007 | Kildal | 702/182 |
| 7,323,884 B2* | 1/2008 | Stojcevic | 324/627 |
| 2002/0053298 A1 | 5/2002 | Fogle, Jr. | |
| 2005/0230387 A1 | 10/2005 | Regan | |

* cited by examiner

*Primary Examiner*—Hoang V Nguyen

(57) ABSTRACT

A method and apparatus for RF suppression is disclosed. The method comprises the steps of mounting a first RF antenna into an RF suppression enclosure. The RF suppression enclosure has an opening in one side of the enclosure. The first RF antenna is aligned with a target area of use through the opening. The RF suppression enclosure is aligned such that radiation from a second RF antenna is reduced by the RF suppression enclosure before reaching the first antenna inside the enclosure.

20 Claims, 7 Drawing Sheets

RADIO FREQUENCY INTERFERENCE SUPPRESSION ENCLOSURE

BACKGROUND OF THE INVENTION

1. Field of the Invention

The invention is related to the field of communications, and in particular, to a system and method for radio frequency (RF) suppression.

2. Description of the Prior Art

The use of wireless devices has been increasing at a rapid rate. Service providers are responding to this demand by installing multiple wireless antennas in numerous locations. The installation of additional antennas in locations with previously installed antennas or other radiation sources may be difficult due to the interference from the previously installed antennas. The interference may degrade performance for a customer by increasing noise levels in calls or preventing call connections. Therefore there is a need to place new antennas in locations having signals from nearby antennas and allow the newly placed antenna to function properly

SUMMARY OF THE INVENTION

A method and apparatus for radio frequency (RF) suppression is disclosed. The method comprises the steps of mounting an RF antenna into an RF suppression enclosure. The RF suppression enclosure has an opening in one side of the enclosure. The RF antenna is aligned with a target antenna through the opening. The RF suppression enclosure is positioned such that radiation from other RF antennas is reduced by the RF suppression enclosure before reaching the antenna inside the enclosure.

DETAILED DESCRIPTION OF THE PREFERRED EMBODIMENT

Figure 1:
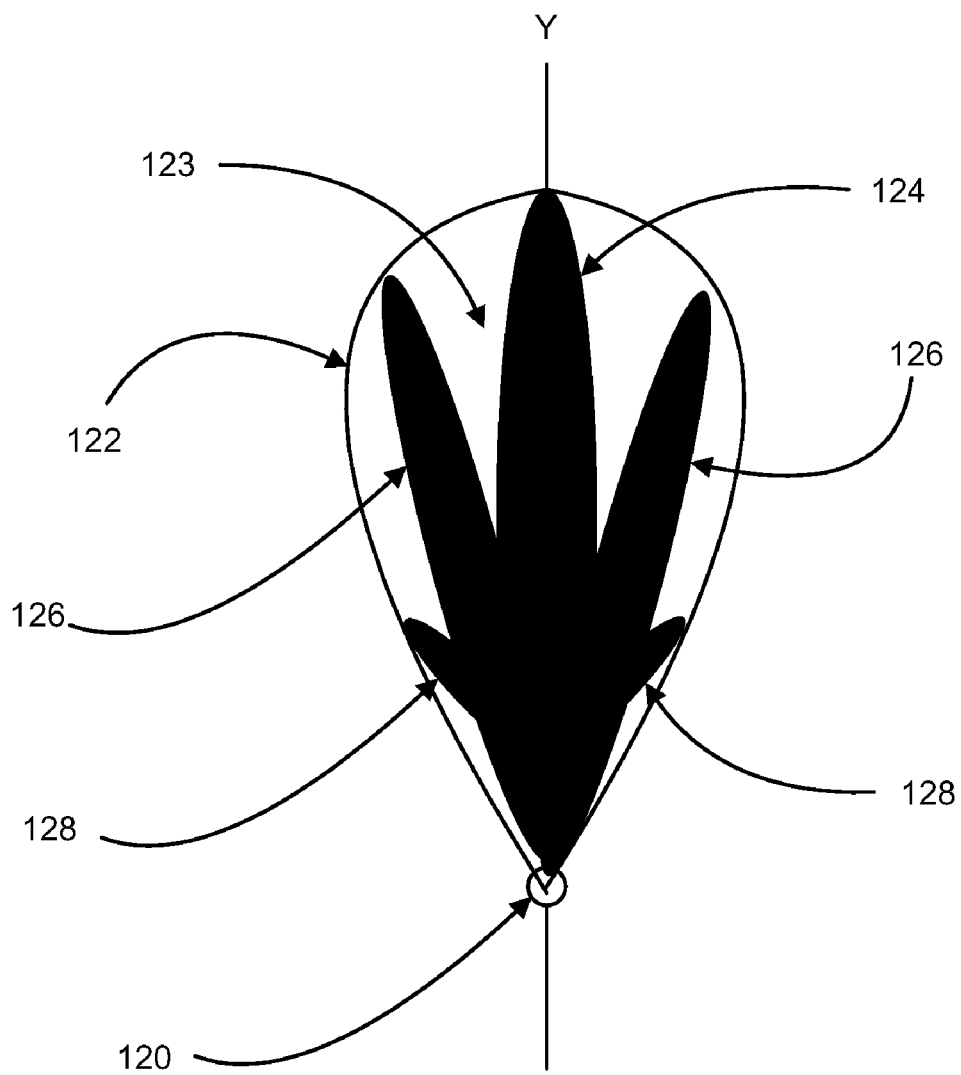
FIG. 1 is a radiation pattern of an antenna in an example embodiment of the invention.

RF antennas typically are more sensitive to transmitted and received signals along one or more axis. FIG. 1 is a radiation pattern of an antenna in an example embodiment of the invention. FIG. 1 has antenna 120 shown as a point source for clarity, but antenna 120 may take a variety of shapes. Antenna 120 has a tuned sensitivity along axis Y. In one example embodiment of the invention the sensitivity of antenna 120 is shown by curve 122. Curve 122 has a smoothly varying shape with a maximum sensitivity along axis Y. In another example embodiment of the invention, antenna 120 may have a sensitivity shown by curve 123. Curve 123 has a number of lobes with varying sensitivity, with the largest lobe (124) aligned along axis Y. Curve 123 has a number of secondary lobes (126 and 128) that diminish in peak sensitivity as the angle with respect to Y axis increases.

In use, an RF antenna is typically aligned such that the peak sensitivity is directed towards an area of use, for example at a target antenna. If other sources of RF radiation are located along an axis corresponding to a region of high sensitivity for the antenna the antenna may not function properly. The other source of radiation may be previously installed antennas. Some of the previously installed antennas may be omni-directional and some may have a directional sensitivity. Antennas with directional sensitivity may produce radiation that overlaps or extends into areas away from the aligned direction of use. This overlapped radiation may create problems when installing additional antennas.

Figure 2:
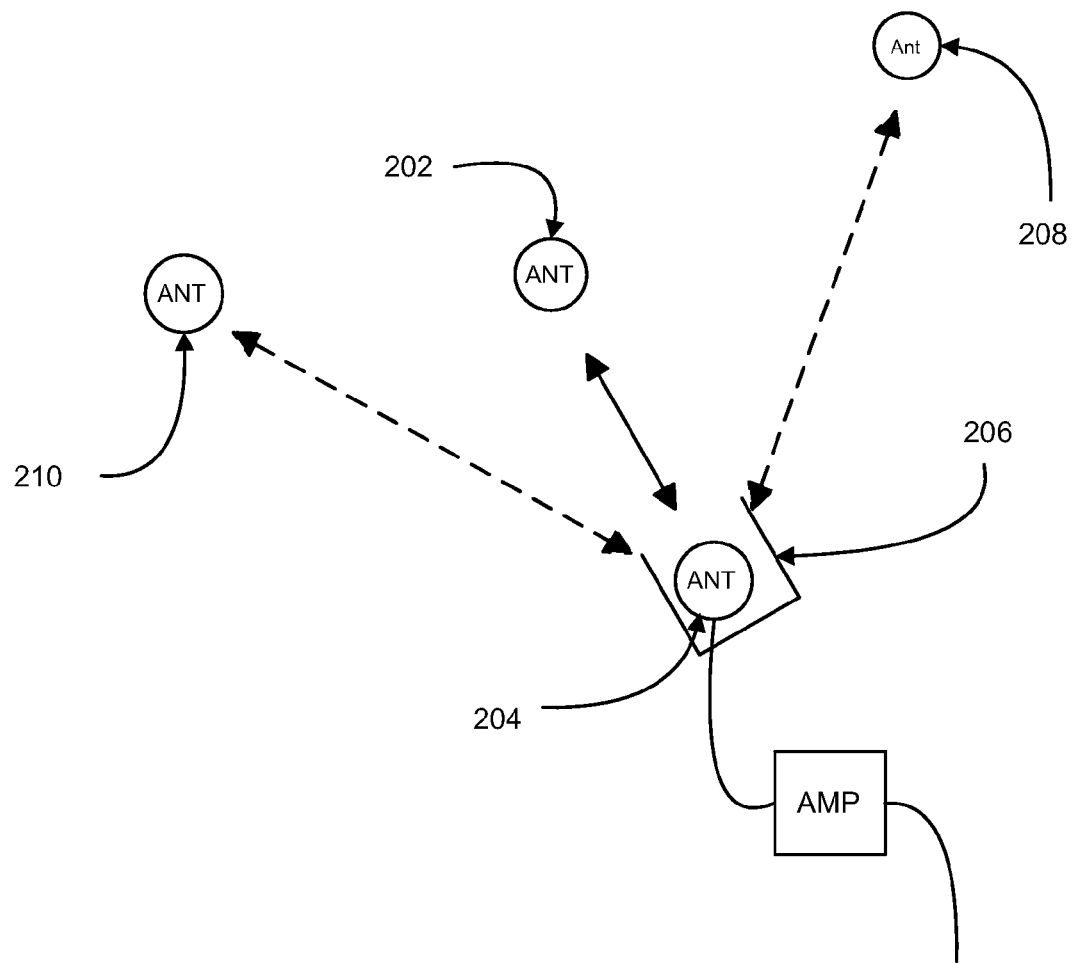
FIG. 2 is a diagram of antenna placement in an example embodiment of the invention.

FIG. 2 is a diagram for antenna placement in an example embodiment of the invention. FIG. 2 comprises a target antenna 202, a new antenna 204, a suppression enclosure 206, and two previously installed antennas 208 and 210. New antenna 204 is located inside suppression enclosure 206 and aligned with target antenna 202. Suppression enclosure 206 absorbs and/or reflects radio frequency (RF) radiation. Suppression enclosure 206 reduces the amount of RF radiation reaching new antenna (204) from the two previously installed antennas (208 and 210) allowing the new antenna (204) to function properly. New antenna (204) and target antenna (202) are typically operated by the same service provider. The two previously installed antennas (208 and 210) may be operated by the same service provider that operates new antenna (204) or by different service providers.

In another example embodiment of the invention, two new antennas may be located where antenna 204 is shown. One new antenna targeted at antenna 202 and one new antenna used as an in-building antenna. The two new antennas would each be located in their own suppression enclosure, where the two suppression enclosures would be back-to-back or side-by-side with each opening in the suppression enclosures pointing in a different direction. By using the two suppression enclosures the two antennas may be located near or adjacent to each other without causing feedback oscillation. In some cases, a set of antennas could be housed in an integrated set of suppression enclosures, where the set of integrated enclosures has a round shape to provide 360 degree coverage from the internal antennas to the surrounding area.

Figure 3:
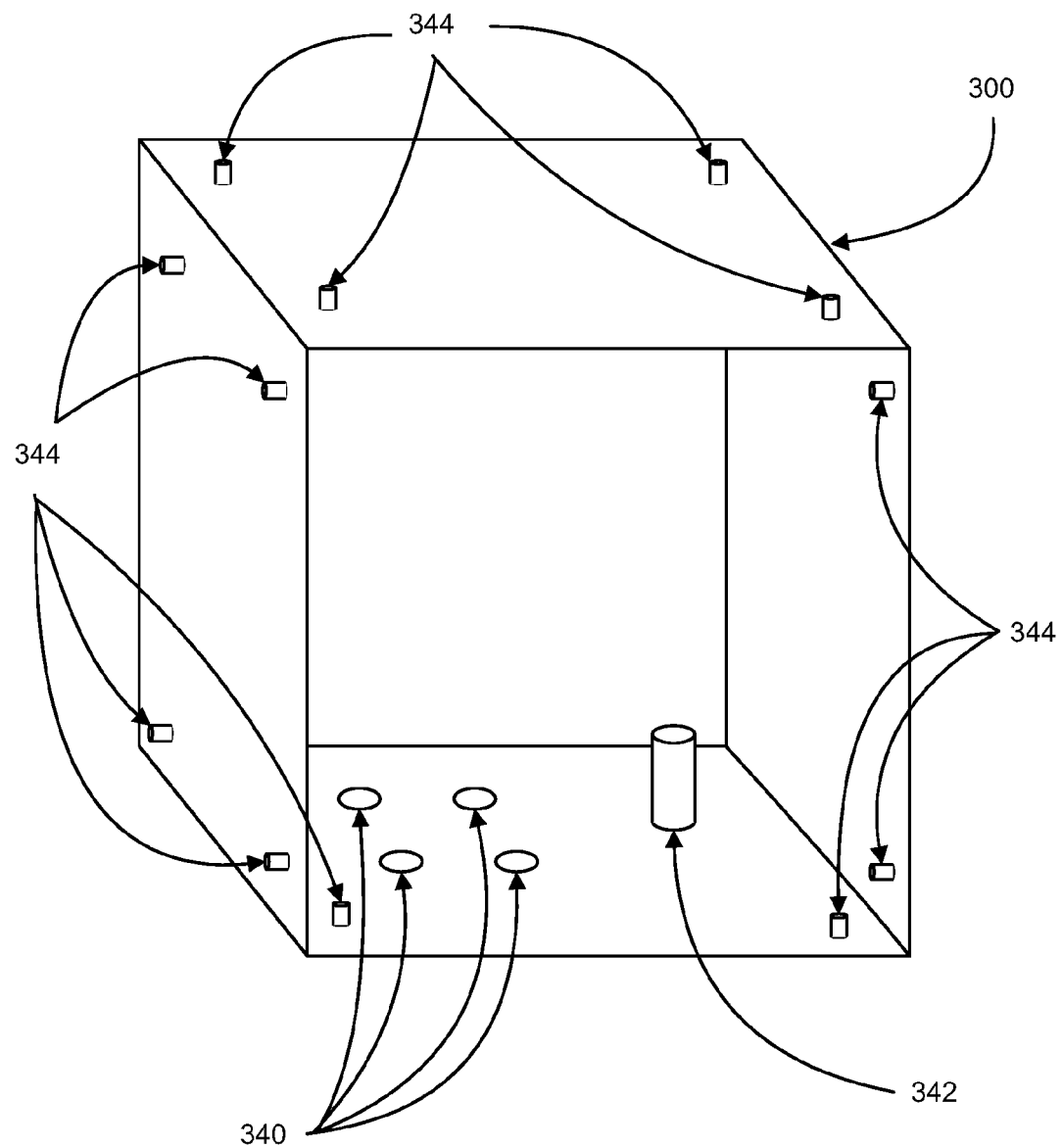
FIG. 3 is an isometric view of a suppression enclosure in an example embodiment of the invention.

FIG. 3 is an isometric view of a suppression enclosure in an example embodiment of the invention. Suppression enclosure 300 may be a rectangular box with one open side. An enclosure is defined as a 3-dimensional shape that has a generally hollow inside area. Suppression enclosure 300 may be fabricated from aluminum, steel, plastic, fiberglass, or the like. In one example embodiment of the invention, enclosure 300 is fabricated from $1/16$ to $1/8$ inch thick aluminum. In operation an antenna (not shown) is mounted inside suppression enclosure 300. An RF absorption material is located on the surfaces of the suppression enclosure 300. In one example embodiment of the invention, the back surface and/or the bottom surface may not have a layer of the RF absorption material. In other example embodiments of the invention, all the enclosing surfaces have a layer of the RF absorption material. The RF absorption material may be located on the inside of suppression enclosure 300 or may be located on the outside of suppression enclosure 300. The thickness of the RF absorption layer may be adjusted to select the desired reduction in signal strength for RF radiation passing through absorption layer. In one example embodiment of the invention, the absorption layer thickness is selected to provide an 80-100 db reduction in RF radiation passing through the absorption layer before reaching the antenna mounted inside the enclosure.

RF absorption materials are well known in the arts and are typically comprised of a binder or base carrier product mixed with a blocking agent. There are different types of blocking agents which form radiation or wave absorption materials. Relatively popular, ferromagnetic materials include carbonyl iron or ferrite oxide mixed with other oxides or ferrites or garnet, and materials such as magnesium, nickel, lithium, yttrium, and/or calcium vanadium. The particle sizes of the blocking agents range from typically about four microns to about 20 microns. The particle size and ferrite content of the mixture depends generally on the frequency of the radiation to be blocked. Various types of binders may be used with the blocking agents. For example, silicone, epoxy, neoprene, polyvinyl chloride, foam and the like are all satisfactory binder materials for the blocking agents.

In one example embodiment of the invention, suppression enclosure 300 may contain antenna mounting holes 340 or an antenna mounting bracket, and a feed through fitting 342 formed in one side of suppression enclosure 300. FIG. 3 shows the antenna mounting holes 340 and the feed through fitting 342 formed in the bottom side of suppression enclosure 300. Feed through fitting 342 may take the form of a simple hole or may take the form of a connector that allows a coax cable to be plugged into the outside of the suppression enclosure 300 and provides power and signal connections on the inside of suppression enclosure 300.

Figure 4:
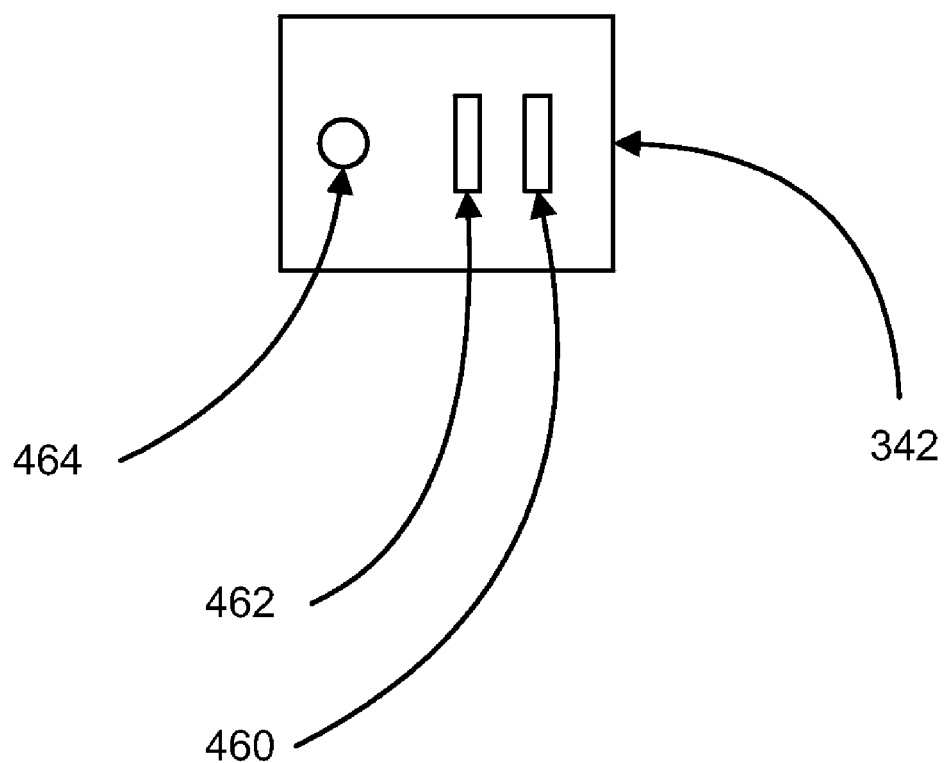
FIG. 4 is a front view of a pass-through connection block in an example embodiment of the invention.

FIG. 4 is a front view of a feed through fitting 342 in an example embodiment of the invention. Feed through fitting 342 comprises coax connector 464, power connector 462 and data connector 460. Feed through fitting 342 allows the antenna mounted in the suppression enclosure to be coupled to an outside cable by connecting the antenna to coax connector 464. Other equipment, for example a GPS system, may be co-located with the antenna inside the suppression enclosure by coupling the equipment to the power (462) and data (460) connectors in feed-through fitting.

Figure 5:
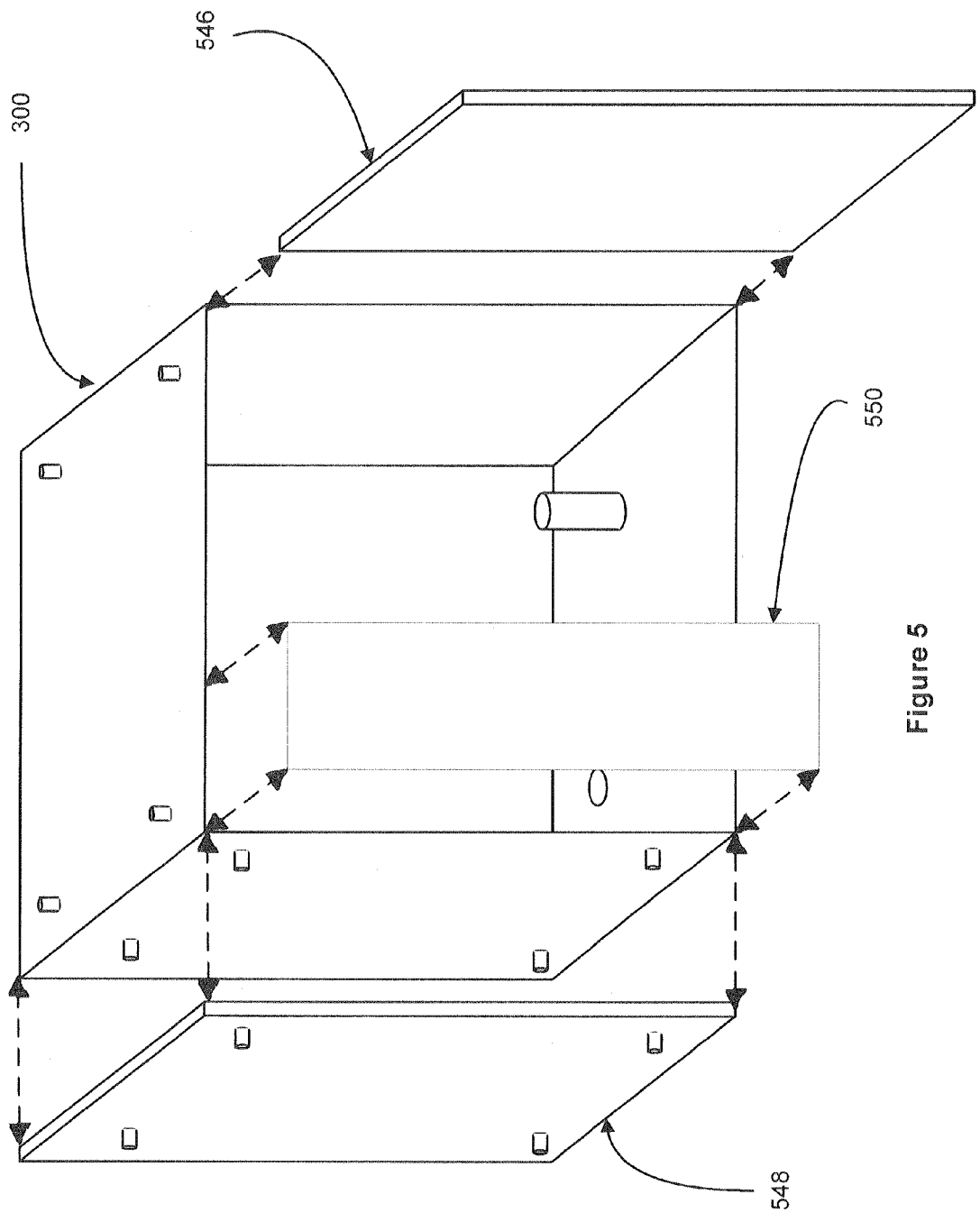
FIG. 5 is an isometric exploded view of suppression enclosure 400 with three suppression panels in an example embodiment of the invention.

In one example embodiment of the invention, suppression enclosure 300 may contain mounting points 344 located on the sides, the front and the top of the suppression enclosure 300. Mounting points 344 may take any form including studs, threaded holes, holes, brackets, and the like. Mounting points 344 may be used to mount additional suppression panels onto suppression enclosure 300. FIG. 5 is an isometric exploded view of suppression enclosure 300 with three suppression panels (546, 548 and 550) in an example embodiment of the invention.

Suppression panels 546, 548 and 550 may be constructed from aluminum, steel, plastic, fiberglass, or the like. An RF absorption material coats one side of the suppression panel. Suppression panels may be mounted onto a suppression enclosure to help attenuate RF signals from other RF sources. Suppression panels may help attenuate RF signals in three ways. The first way a suppression panel can help attenuate RF signals is to extend the suppression enclosure's size. The second way a suppression panel can help reduce RF signals is to add an additional RF absorption layer for an existing location on the suppression enclosure. The third way a suppression panel can help reduce RF signals is to narrow the opening on the front side of the suppression enclosure.

Suppression panel 546 is shown positioned to be mounted onto the front mounting points on the right side of suppression enclosure 300. Suppression panel 546 extends the length of suppression enclosure 300 on the right side. Suppression panel 546 may be used when an RF source is located such that RF radiation is not fully blocked (or absorbed) by the side of the suppression enclosure 300. By extending the length of the right side of suppression enclosure 300, an RF source that would not normally be blocked by the right side of the suppression enclosure may be blocked. Suppression panels may be added to either side, the top or the bottom of suppression enclosure 300. Suppression panel 546 may have mounting points that replicate the pattern of mounting points on the suppression enclosure such that additional suppression panels can be added to suppression panel 546 to further extend the length of the suppression enclosure 300.

Suppression panel 548 is shown positioned to be mounted onto the left side of suppression enclosure 300. In some instances, an RF source may be so strong that the reduction in the RF signal passing through the suppression enclosure may not be enough to allow the antenna mounted inside the suppression enclosure to operate properly. By mounting a suppression panel onto the side of the suppression enclosure, the RF signal passing through that side of the suppression enclosure may be reduced by an additional amount. Mounting points that replicate the pattern of mounting points on the suppression enclosure may be located on the outside of suppression panel 548 such that additional suppression panels may be mounted on top of suppression panel 548 to further reduce the RF signal passing through that side of suppression enclosure 300. Any number of suppression panels can be added to increase the absorption through the suppression enclosure. Suppression panels may be added to either side, the back or the top of suppression enclosure 300.

Suppression panel 550 is shown positioned to be mounted onto the front side of suppression enclosure 300 such that the opening in the front side is narrowed. Suppression panel 550 may be used when an RF source is located such that RF radiation is not fully blocked (or absorbed) by the side or top of the suppression enclosure 300. By narrowing the opening of the suppression enclosure 300, an RF source that would not normally be blocked by the side or top of the suppression enclosure may be blocked. Suppression panels may be added to either side, the top or the bottom of suppression enclosure 300 to narrow the opening in the front face of the suppression enclosure 300.

Suppression enclosure 300 is shown shaped as a rectangle. Suppression enclosure 300 may take other shapes, for example a hollow sphere with a hole in one face, a rounded rectangle, a square, an open ended cylinder or the like. Suppression panels for the differently shaped suppression enclosure would be shaped to match the shape of the differently shaped suppression enclosure. Suppression enclosure 300 is shown with the front face completely open. In other example embodiments of the invention, the front face of the suppression enclosure may not be completely open, but may have a smaller opening formed in a front face of the suppression enclosure.

Figure 6:
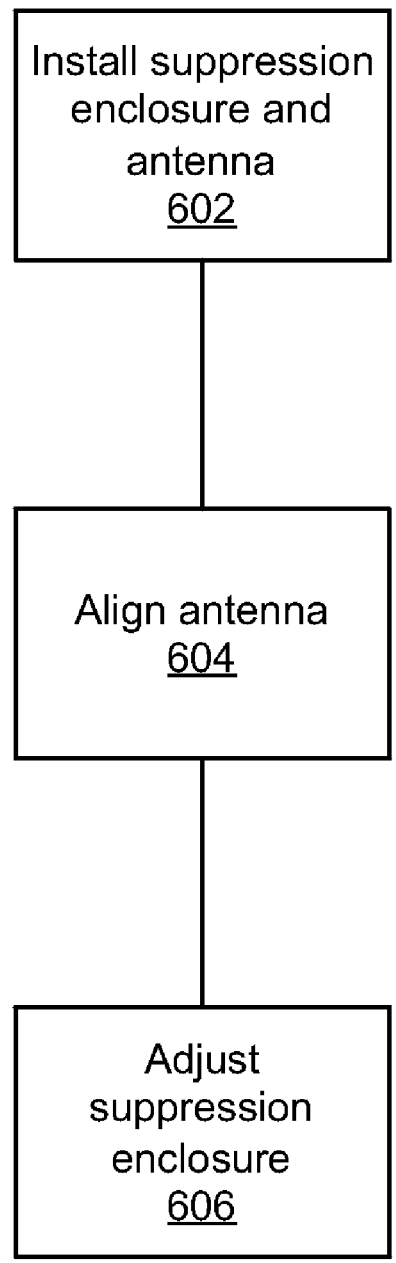
FIG. 6 is a flow chart showing a method for using a suppression enclosure in an example embodiment of the invention.

FIG. 6 is a flow chart showing a method for using a suppression enclosure in an example embodiment of the invention. The method starts at step 602 where the suppression enclosure and antenna are installed at a target location. The antenna is aligned to an area of use in step 604. The suppression enclosure is adjusted in step 606. In some example embodiments of the invention, step 606 may be done before step 604, or an iterative process using steps 604 and step 606 may be used to align the antenna inside the suppression enclosure and optimize the alignment of the suppression enclosure to reduce the RF signals from other sources.

Step 602 may include mounting the suppression enclosure at the target location, installing the antenna inside the suppression enclosure, and routing cabling to the antenna. Step 604 may include visually aligning the antenna, or may include measuring the strength of a signal as the antenna is adjusted to maximize the signal strength. Step 606 may include adjusting the location or orientation of the suppression enclosure, adding suppression panels to extend the size of the suppression enclosure, adding suppression panels to narrow the opening and/or adding suppression panels to increase the amount of signal absorbed by the suppression enclosure. Step 606 may be done visually or by measuring the signal strength from the RF sources that may need to be blocked. The signal strength of the RF source that needs to be blocked can be measured using the antenna inside the suppression enclosure or using an external device.

Figure 7:
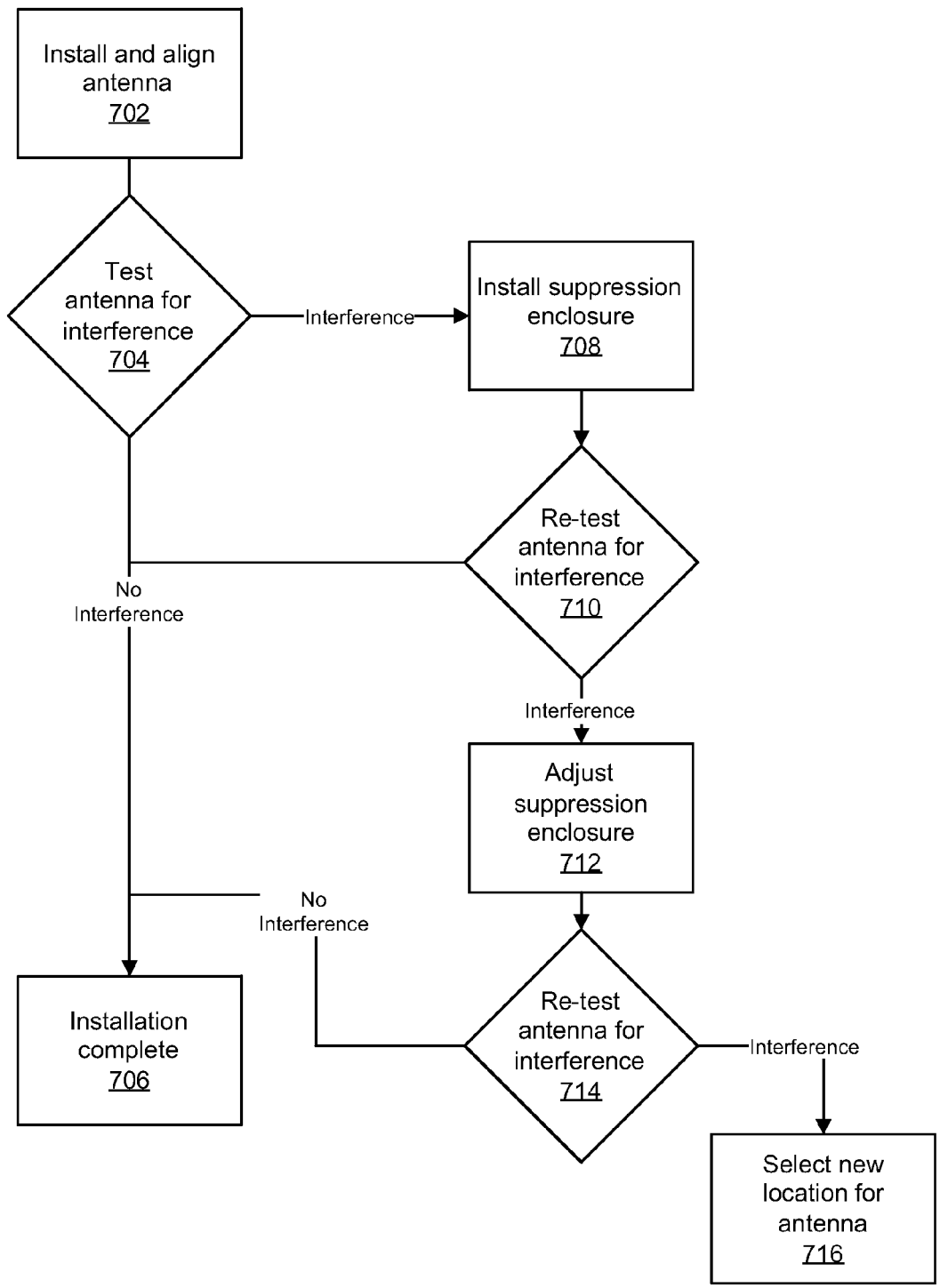
FIG. 7 is a flow chart showing a method for using a suppression enclosure in another example embodiment of the invention.

FIG. 7 is a flow chart showing a method for using a suppression enclosure in another example embodiment of the invention. The method starts at step 702 where an antenna is installed at a target location and aligned to a target area of use. Alignment of the antenna may be done visually or while monitoring the signal strength of a signal from the antenna. At step 704 the antenna is tested for interference from other radiation sources. When the antenna functions properly without external interference, flow stops at step 706. When interference from external sources prevents the antenna from functioning properly, a suppression enclosure is installed at step 708. During installation of the suppression enclosure the antenna may be removed and re-mounted inside the suppression enclosure. The antenna is re-aligned to the target area of use. At step 710 the antenna is re-tested for interference. When the antenna functions properly without external interference, flow stops at step 706. When interference from external sources prevents the antenna from functioning properly, the suppression enclosure is adjusted in step 712. Step 712 may include adjusting the orientation of the suppression enclosure, adding suppression panels to extend the size of the suppression enclosure, adding suppression panels to narrow the opening and/or adding suppression panels to increase the amount of signal absorbed by the suppression enclosure. At step 714 the antenna is re-tested for interference. When the antenna functions properly without external interference, flow stops at step 706. When interference from external sources prevents the antenna from functioning properly, a new location for the antenna is selected at step 716.

The above description and associated figures teach the best mode of the invention. The following claims specify the scope of the invention. Note that some aspects of the best mode may not fall within the scope of the invention as specified by the claims. Those skilled in the art will appreciate that the features described above can be combined in various ways to form multiple variations of the invention. As a result, the invention is not limited to the specific embodiments described above, but only by the following claims and their equivalents.

What is claimed is:

1. A method for RF suppression, comprising:
   mounting a first RF antenna into an RF suppression enclosure wherein the RF suppression enclosure has an opening;
   aligning the first RF antenna with a target area of use through the first opening;
   measuring a level of radiation from a second RF antenna to determine a proper adjustment of the suppression enclosure;
   adjusting the RF suppression enclosure based on the proper adjustment such that radiation from the second RF antenna is reduced by the RF suppression enclosure before reaching the first antenna.

2. The method for RF suppression of claim 1 wherein the target area of use is a target antenna.

3. The method for RF suppression of claim 1 wherein the first antenna is a repeater antenna.

4. The method for RF suppression of claim 1 wherein adjusting the suppression enclosure includes adding at least one suppression panel.

5. The method for RF suppression of claim 4 wherein the at least one suppression panel extends beyond a length of the suppression enclosure.

6. The method for RF suppression of claim 4 wherein the at least one suppression panel adds a layer of an absorption material onto the suppression enclosure.

7. The method for RF suppression of claim 4 wherein the at least one suppression panel narrows the opening in the suppression enclosure.

8. The method for RF suppression of claim 1, wherein the first RF antenna is mounted and aligned with a target area of use and then tested to determine if the suppression enclosure is needed before the first RF antenna is mounted into the RF suppression enclosure.

9. The method for RF suppression of claim 1, further comprising:
   testing the first antenna after the suppression enclosure has been adjusted to determine if radiation from the second RF antenna has sufficiently reduced to allow the first antenna to function properly.

10. The method for RF suppression of claim 1 wherein aligning the first RF antenna with the target area of use is done visually.

11. An RF suppression device, comprising:
    an enclosure having a first opening;
    a mounting system inside the enclosure for mounting a radio frequency (RF) antenna such that the RF antenna can be aligned to point out through the opening;
    an RF absorption layer located on at least one surface of the enclosure and configured to reduce RF energy, from a third antenna located outside the enclosure, passing through the at least one surface before reaching the RF antenna inside the enclosure;
    at least one suppression panel mounted onto the enclosure, wherein the at least one suppression panel is mounted onto a front side of the enclosure and extends beyond the front of the enclosure.

12. The RF suppression device of claim 11 wherein the enclosure takes a shape selected from the following group: a rectangle, a rounded rectangle, a sphere, an open ended cylinder, and a square.

13. The RF suppression device of claim 11 wherein the RF absorption layer is located on the inside of the enclosure.

14. The RF suppression device of claim 11 wherein the at least one suppression panel is mounted onto the enclosure such that the suppression panel overlaps with the enclosure.

15. The RF suppression device of claim 11, further comprising:
    a pass-through connector mounted on the enclosure and configured to couple to a coax cable on an outside of the enclosure and provide a separate power and coax connection on an inside of the enclosure.

16. The RF suppression device of claim 11 wherein the RF absorption layer is configured to reduce RF radiation passing through the RF absorption layer by at least 80 db.

17. An RF suppression device, comprising:
    an enclosure having a first opening;
    a mounting system inside the enclosure for mounting a radio frequency (RF) antenna such that the RF antenna can be aligned to point out through the opening;

an RF absorption layer located on at least one surface of the enclosure and configured to reduce RF energy, from a third antenna located outside the enclosure, passing through the at least one surface before reaching the RF antenna inside the enclosure;

at least one suppression panel mounted onto the enclosure, wherein the at least one suppression panel is mounted onto a front side of the enclosure and reduces a size of the opening.

18. The RF suppression device of claim 17 wherein the RF absorption layer is located on the inside of the enclosure.

19. The RF suppression device of claim 17 wherein the at least one suppression panel is mounted onto the enclosure such that the suppression panel overlaps with the enclosure.

20. The RF suppression device of claim 17, further comprising:

a pass-through connector mounted on the enclosure and configured to couple to a coax cable on an outside of the enclosure and provide a separate power and coax connection on an inside of the enclosure.

* * * * *